United States Patent [19]

Shima et al.

[11] 4,007,414
[45] Feb. 8, 1977

[54] CURRENT TRANSDUCER ARRANGEMENT

[75] Inventors: Seiya Shima, Katsuta; Korefumi Tashiro, Hitachi, both of Japan

[73] Assignee: Hitachi, Ltd., Japan

[22] Filed: July 9, 1975

[21] Appl. No.: 594,252

[30] Foreign Application Priority Data

July 12, 1974 Japan .............................. 49-79181

[52] U.S. Cl. .................................. 323/6; 324/127
[51] Int. Cl.$^2$ ...................................... G01R 19/00
[58] Field of Search ..................... 323/6, 48, 83; 324/117 R, 123 C, 127

[56] References Cited

UNITED STATES PATENTS

| | | | |
|---|---|---|---|
| 2,950,438 | 8/1960 | Gilbert | 324/127 X |
| 3,136,948 | 6/1964 | Windsor | 324/127 |
| 3,500,195 | 3/1970 | Specht | 324/127 X |
| 3,916,310 | 10/1975 | Stark et al. | 324/127 |

*Primary Examiner*—A. D. Pellinen
*Attorney, Agent, or Firm*—Craig & Antonelli

[57] ABSTRACT

A current transducer arrangement for detecting the magnitude and the polarity of a large current, wherein at least three current transducers and a majority circuit are comprised, each of the current transducers including a primary winding, a saturable core, a secondary winding magnetically coupled with the primary winding through the saturable core, a resistor, and having an alternating voltage supplied to the secondary winding, wherein the primary windings of the current transducers are connected in series, the large current flowing through the series-connected primary windings, wherein the alternating voltages to be supplied to the secondary windings of the current transducers are respectively different in phase, and wherein the majority circuit provides an output voltage proportional to an output voltage value occupying the greatest number of the current transducers. The current transducer arrangement can detect a D.C. current of a transmission system or an A.C. current containing a D.C. component in electrical isolation therefrom in a response time in the order of microseconds.

13 Claims, 7 Drawing Figures

CURRENT TRANSDUCER ARRANGEMENT

FIELD OF THE INVENTION

This invention relates to an apparatus which detects the magnitude and the polarity of a large current containing a D.C. component in electrical isolation from the large current. More particularly, it relates to a current transducer arrangement which employs a plurality of current transducers each making use of a reactor having a saturable core.

This invention is applicable to the detection of a current of a transmission system at a high voltage, for example, 1,000,000 kV, the detection of a current of a D.C. transmission system, etc. to which conventional current transducers cannot be applied.

DESCRIPTION OF THE PRIOR ART

There has been already known a current transducer which serves for the electrically isolated detection of a large current containing a D.C. component and which comprises a reactor having a saturable core and means to supply an alternating voltage to the reactor.

An apparatus which exploits a current flowing through a secondary winding during saturation of the saturable core of the reactor in the current transducer detects the large current through a voltage obtained by smoothing an output voltage of the current transducer. Therefore, it has the disadvantage that a continuous current detection and an instantaneous current detection are impossible.

An apparatus which exploits a current flowing through the secondary winding during non-saturation of the saturable core of the reactor in the current transducer involves also the current flowing through the secondary winding during the saturation of the saturable core of the reactor. Therefore, it is disadvantageously incapable of the continuous detection.

An apparatus which, in order to eliminate these disadvantages, utilizes a plurality of current transducers and detects the large current by taking out only output voltages of a correct value from among the outputs of the current transducers has been already known from an apparatus adopting an F. L. S., diode or thyristor. In such apparatus, only the current flowing through the secondary winding in the saturation period of the saturable core of each reactor is derived, and a continuous output voltage is obtained owing to the plurality of current transducers.

Such apparatus, however, exploits for the current detection only the unidirectional current flowing through the secondary winding. In order to detect the large current together with the polarity thereof, it is necessary to increase the number of transducers or to additionally provide a device for detecting the polarity of the large current.

SUMMARY OF THE INVENTION

An object of this invention is to provide a current transducer arrangement for detecting the magnitude and the polarity of a current containing a D.C. component in electrical isolation from the current.

Another object of this invention is to provide a current transducer arrangement for detecting a large current continuously and instantaneously.

According to the current transducer arrangement of this invention for detecting the magnitude and the polarity of a large current, at least three transducers and a majority circuit are comprised; each of the current transducers is composed of (a) a reactor having a primary winding, a saturable core and a secondary winding, (b) a resistor connected in series with the secondary winding of the reactor and (c) means to supply an alternating voltage to the secondary winding of the reactor and the resistor; the primary windings of the reactors are connected in series; the alternating voltages to be supplied to the secondary windings of the reactors and the resistors in the respective current transducers have phases different from one another; the transducers produce output voltages proportional to the large current at the respective resistors during periods during which the saturable cores of the respective reactors are not saturated; the majority circuit is composed of scale changers and a common load resistor; the scale changers are connected to output ends of the corresponding current transducers and have equal magnifying factors, equal saturation output voltages and equal output impedances; outputs of the scale changers are delivered to the load resistor; and a voltage which is proportional to a voltage value commanding a majority of the output voltages of the current transducers is produced at the load resistor.

DESCRIPTION OF THE PREFERRED EMBODIMENT

Figure 1:
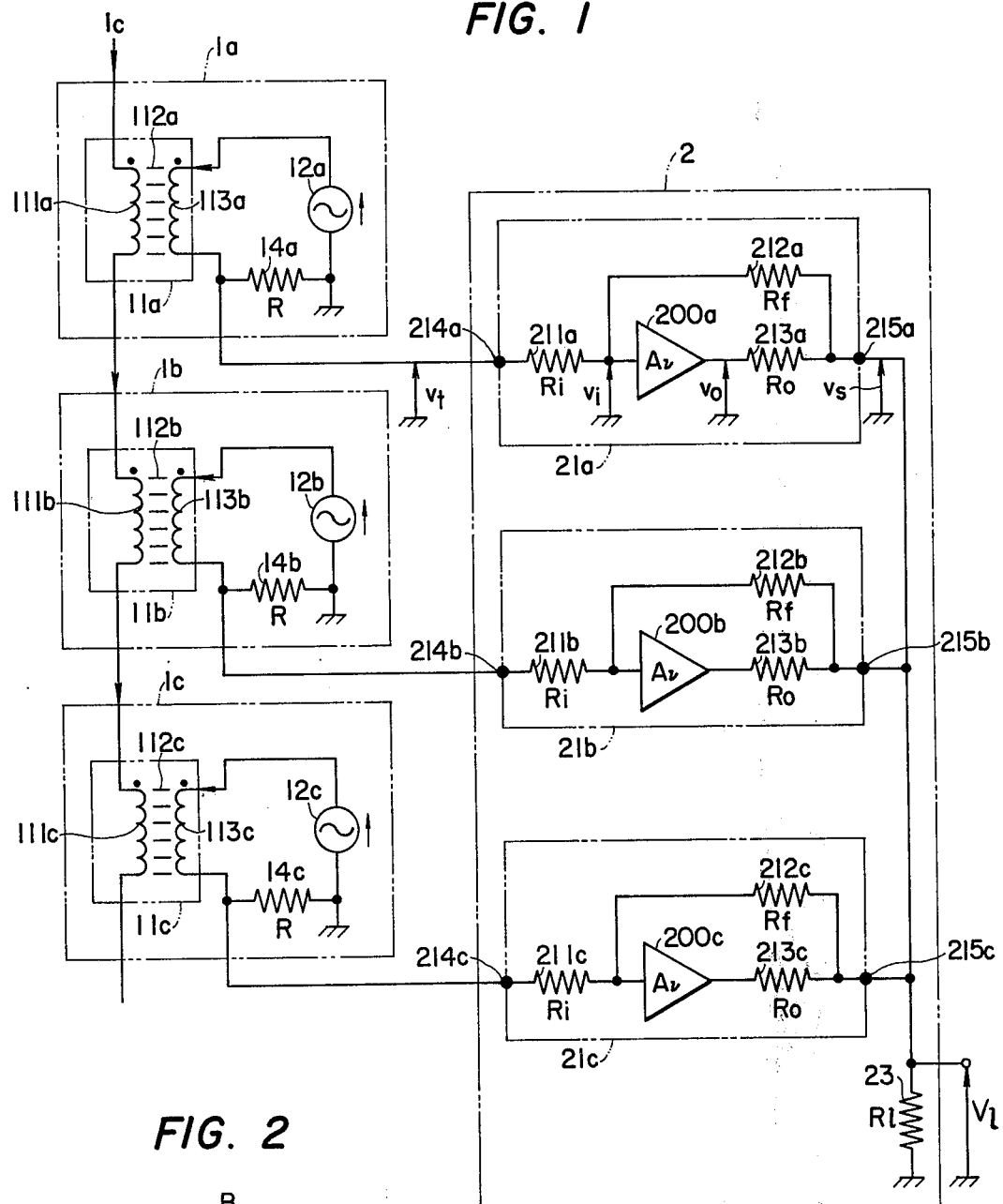
FIG. 1 is a diagram which shows the fundamental circuit arrangement of a current transducer arrangement according to this invention.

FIG. 1 shows a transducer arrangement embodying this invention for detecting the magnitude and polarity of a large current containing a D.C. component, the arrangement having three current transducers 1a, 1b and 1c and a majority circuit 2.

The current transducers 1a, 1b and 1c provide voltages proportional to the large current at output ends thereof, respectively.

All the current transducers have the same construction. The respective current transducers are distinguished by suffixes a, b and c.

Each current transducer 1a, 1b, 1c comprises a reactor 11a, 11b, 11c, an alternating voltage source 12a, 12b, 12c and a resistor 14a, 14b, 14c. Each reactor 11a, 11b, 11c includes a primary winding 111a, 111b, 111c, a saturable core 112a, 112b, 112c and a secondary winding 113a, 113b, 113c. The primary windings 111a, 111b and 111c of the reactors 11a, 11b and 11c constituting the current transducers 1a, 1b and 1c, respectively, are connected in series. It is assumed that the large current Ic containing the D.C. component is flowing through the primary windings in the direction of arrow. To the secondary windings 113a, 113b and 113c of the reactors of the respective transducers, sinusoidal voltages having a phase difference of 120° therebetween are supplied from the alternating voltage sources 12a, 12b and 12c in the direction of arrows. The polarities of the primary winding 111a, 111b, 111c and the secondary winding 113a, 113b, 113c of the reactor 11a, 11b, 11c in each transducer are indicated by dots in the figure. The direction of a current to flow through a secondary side circuit including the secondary winding is the direction of arrow indicated. During a period during which the saturable core 112a, 112b, 112c of the reactor 11a, 11b, 11c in each current transducer 1a, 1b, 1c is not saturated, a current proportional to the large current Ic flows through the secondary winding 113a, 113b, 113c, and a voltage proportional to the large current Ic appears across the resistor 14a, 14b, 14c. This will be explained hereunder.

Since the current transducers 1a, 1b and 1c have the same construction, the operation of the current transducer 1a will be representatively discussed.

Figure 2:
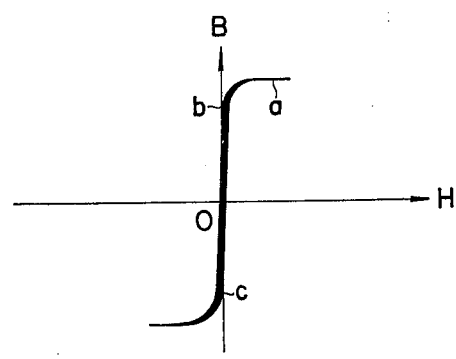
FIG. 2 is a graph which shows a B - H characteristic of a saturable core of a current transducer in the current transducer arrangement according to this invention.
Figure 3A:
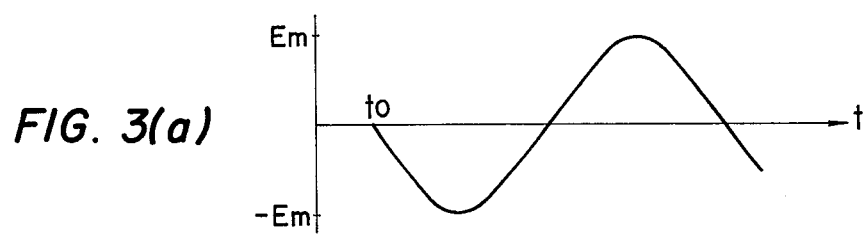
FIGS. 3(a) and 3(b) are graphs which show a waveform of a voltage to be supplied from an alternating voltage source to the transducer and a waveform of an output from the transducer, respectively.

In the current transducer 1a, a sinusoidal voltage of -Em sin ωt (Em: crest value, ω: angular frequency, t: time) as indicated by a solid line in FIG. 3(a) is supplied from the alternating voltage source 12a to the secondary winding 113a. The saturable core 112a of the reactor 11a has a rectangular B - H characteristic curve of small hysteresis as shown in FIG. 2. That is, the exciting current of the saturable core 112a is very small in comparison with the large current Ic.

Figure 3B:
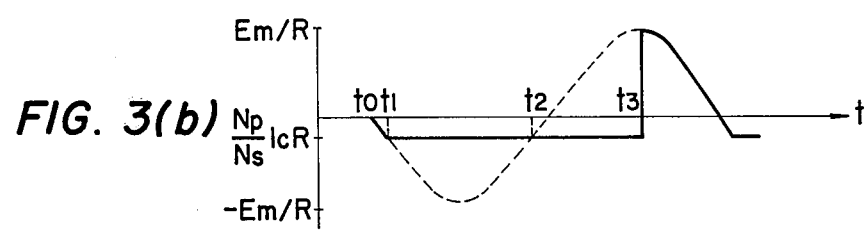

At a time $t_o$ in a graph of FIG. 3(b), the saturable core 112a is already saturated, and the operating point is at $a$ on the B - H characteristic curve shown in FIG. 2. At the saturation, the magnetic permeability $\mu = \Delta B/\Delta H$ of the saturable core is zero. The reactance L of the secondary winding 113a is proportional to the magnetic permeability, and therefore becomes zero. In consequence, a current of $- (Em/R) \sin \omega t \mid_{t=0}$ (where R denotes the resistance of the resistor 14a) flows through the secondary side circuit including the secondary winding 113a. Thereafter, the current flowing through the secondary side circuit changes with time. When a magnetomotive force owing to the current flowing through the secondary side circuit and a magnetomotive force owing to the large current flowing through the primary winding become equal in magnitude and opposite in direction, the operating point of the saturable core gets at $b$ on the B - H characteristic curve shown in FIG. 2. Letting $t_1$ denote this time, the following equation holds:

$$- Em/R) \sin \omega t_1 \cdot N_s - Ic \cdot N_p = 0$$

where $N_p$ represents the number of turns of the primary winding 111a, and $N_s$ the number of turns of the secondary winding 113a.

Subsequently, the saturable core 112a shifts from the saturated state to the unsaturated state. During the period during which the saturable core 112a is not saturated, the magnetic permeability $\mu = \Delta B/\Delta H$ is very large, and the reactance of the secondary winding 113a also becomes large. During this period, therefore, the current from the alternating voltage source scarcely flows through the secondary side circuit including the secondary winding 113a. Only a current of $- Ic \cdot (N_p/N_s)$ conforming with the law of equal ampere-turns flows, and a voltage of $- Ic \cdot (N_p/N_s) \cdot R$ appears across the resistor 14a. At this time, a voltage impressed on the secondary winding 113a is $- Em \sin \omega t + (N_p/N_s) Ic \cdot R$. This voltage magnetizes the saturable core 112a in the opposite direction, with the result that the operating point of the saturable core descends from the point $b$ towards a point $c$ on the B - H characteristic curve shown in FIG. 2. Meanwhile, the magnetic flux $\phi$ changes with time in accordance with the following equation:

$$\phi = \int_{t_1}^{t} \left( - Em \sin \omega t + \frac{N_p}{N_s} \cdot Ic \cdot R \right) dt$$

At a time $t_2$ at which $- Em \sin \omega t + (N_p/N_s) \cdot I \cdot R = 0$ is established, the magnetic flux $\phi$ is minimized (the operating point of the saturable core 112a at the time $t_2$ is the point $c$ on the B - H characteristic curve shown in FIG. 2). Thereafter, the magnetic flux $\phi$ increases with time again. At a time $t_3$ at which the magnetic flux $\phi$ becomes zero again, the operating point of the saturable core 112a returns to the point $b$ on the B - H characteristic curve shown in FIG. 2. Thereafter, the saturable core is saturated again. The time $t_3$ can be evaluated from the following equation:

$$\int_{t_1}^{t} \left( - Em \sin \omega t + \frac{N_p}{N_s} \cdot Ic \cdot R \right) dt = 0$$

Each current transducer 1a, 1b, 1c repeats the operation as stated above. The voltage proportional to the large current Ic is outputted to the resistor 14a, 14b, 14c in the period in which the saturable core 112a, 112b, 112c is not saturated.

In the operation of each current transducer, the period $t_3 - t_1$ during which the saturable core 112a, 112b, 112c of the reactor 11a, 11b, 11c is saturated is termed the saturation region, the period $t_1 - t_2$ during which the operating point of the saturable core 112a, 112b, 112c falls from the point $b$ towards the point $c$ on the characteristic curve shown in FIG. 2 is termed the reset region, and the period $t_2 - t_3$ during which the operating point of the saturable core 112a, 112b, 112c rises from the point $c$ towards the point $b$ on the characteristic curve shown in FIG. 2 is termed the gate region.

Figure 4A:
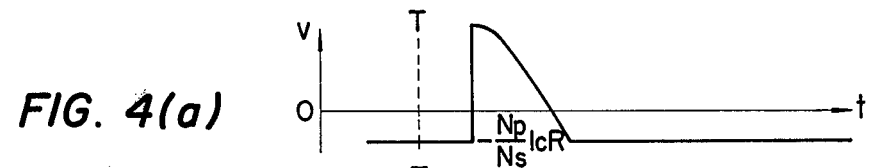
FIGS. 4(a), 4(b) and 4(c) are graphs which show the outputs from the respective transducers.
Figure 4B:
Figure 4C:
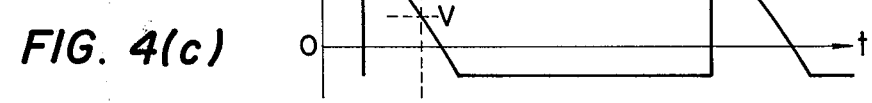

As apparent from the above explanation, each current transducer 1a, 1b, 1c produces the voltage proportional to the large current Ic across the resistor 14a, 14b, 14c in the reset region as well as the gate region.

Where the phase difference of 120° is bestowed on the alternating voltages to be supplied from the alternating voltage sources 12a, 12b and 12c in the respective current transducers 1a, 1b and 1c, the outputs from the respective current transducers 1a, 1b and 1c become as illustrated in FIGS. 4(a), 4(b) and 4(c). It is understood that at least two of the outputs from the three current transducers are the voltages proportional to the large current Ic. Herein, the saturation region of each current transducer shall be within 120°.

Description will now be made of the majority circuit 2 which serve to derive at least two output voltages proportional to the large current Ic among the output voltages of the three current transducers.

As shown in FIG. 1, the majority circuit 2 comprises three scale changers 21a, 21b and 21c and a load resistor 23. The outputs of the three current transducers are connected to input ends 214a, 214b and 214c of the three scale changers 21a, 21b and 21c, respectively. On the other hand, output ends 215a, 215b and 215c of the respective scale changers 21a, 21b and 21c are commonly connected to one end of the load resistor 23 the other end of which is grounded.

The three scale changers 21a, 21b and 21c have the same construction. Each scale changer is composed of an operational amplifier 200a, 200b, 200c, an input resistor 211a, 211b, 211c, a feedback resistor 212a, 212b, 212c and an output resistor 213a, 213b, 213c. Outputs of the scale changers are provided from the respective output ends 215a, 215b and 215c. The input resistor 211a, 211b, 211c is connected between and in series with the input end 214a, 214b, 214c and an input end of the operational amplifier 200a, 200b, 200c; the output resistor 213a, 213b, 213c is connected between and in series with an output end of the operational amplifier 200a, 200b, 200c and the output end 215a, 215b, 215c; and the feedback resistor 212a, 212b, 212c is connected between and in series with the output end 215a, 215b, 215c and the input end of the operational amplifier 200a, 200b, 200c.

The operational amplifiers 200a, 200b and 200c of the respective scale changers 21a, 21b and 21c have great amplification factors Av and saturation output voltages ± Vm which are respectively equal. All the input resistors 211a, 211b and 211c have equal resistances Ri; all the feedback resistors 212a, 212b and 212c have equal resistances Rf; all the output resistors 213a, 213b and 213c have equal resistances Ro; and the load resistor 23 has a resistance Rl. The input resistance Ri and the feedback resistance Rf of each scale changer 21a, 21b, 21c are sufficiently high as compared with the output resistance Ro or the load resistance Rl.

In order to facilitate the explanation of the operation of the majority circuit 2, the resistance Ri of the input resistor and the resistance Rf of the feedback resistor are now selected to be equal.

Since the scale changers 21a, 21b and 21c are the same in construction, the scale changer 21a will be first considered. As indicated in FIG. 1, the voltage of the input end of the scale changer 21a is let to be $v_t$, the voltage of the output end of the operational amplifier 200a is let to be $v_o$, and the voltage of the output end 215a is let to be $v_s$. Then, $$v_o = -\frac{Rf + Ro}{Ri} \cdot \frac{1}{1 - \frac{1}{Av} - \frac{1}{Av} \cdot \frac{Rf + Ro}{Ri}} v_t$$

Here Ro << Rf and Rf = Ri, so that $$v_o \approx -v_t$$

Since Ro << Rf, $$v_o \approx v_s \approx -v_t$$

Let's consider a case where, at a time T on the time axis t in the graphs of FIGS. 4(a) – 4(c), the voltage of $-(N_p/N_s) \cdot Ic \cdot R$ is inputted to the respective inputs ends 214a and 214b of the two scale changers 21a and 21b, and a voltage, V is inputted to the input end 214c of the scale changer 21c. Herein, $V > -(N_p/N_s) \cdot Ic \cdot R$.

At this time, a voltage of $(N_p/N_s) \cdot Ic \cdot R$ appears at the respective output ends 215a and 215b of the scale changers 21a and 21b, while a voltage of $-V$ appears at the output end 215c of the scale changer 21c. The voltage of the load resistor 23 becomes $$v_l = \left( 2 \frac{\frac{N_p}{N_s} Ic\, R - v_l}{Ro} + \frac{-V - v_l}{Ro} \right)$$

as follows $$v_l = 2 \frac{\frac{N_p}{N_s} Ic\, R - V}{Ro + 3 R_l} R_l .$$

Simultaneously, this voltage $v_l$ is fed back to the inputs ends of the operational amplifiers 200a, 200b and 200c of the respective scale changers 21a, 21b and 21c. At this time, the negative voltage is applied to the input ends of the operational amplifiers 200a and 200b, and the positive voltage is applied to the input end of the operational amplifier 200c. Consequently, the operational amplifiers 200a and 200b increase the outputs in the positive direction, and the operational amplifier 200c increases the output in the negative direction. Since, however, there are two operational amplifiers providing the output of $(N_p/N_s)$ Ic R, the operational amplifier 200c saturates the output in the negative direction earlier, and the two operational amplifiers 200a and 200b increase the output voltages in the positive direction until the voltage $v_l$ of the load resistor 23 becomes $(N_p/N_s)$ Ic R.

In the foregoing manner, the majority circuit 2 provides at the load resistor 23 the voltage which is proportional to the voltage value occupying at least two of the voltages of the input ends 214a, 214b and 214c of the respective scale changers 21a, 21b and 21c. In order to continuously provide the output which is proportional to the voltage value occupying at least two of the voltages of the three input ends 214a, 214b and 214c, a condition to be specified below need be satisfied.

The condition is that at least two of the operational amplifiers of the three scale changers 21a, 21b and 21c are unsaturated.

When the operational amplifiers 200a and 200b are saturated in the positive direction and the operational amplifier 200c is saturated in the negative direction, the voltage $v_l$ of the load resistor 23 becomes $$v_l = R_l \left( 2 \frac{Vm - v_l}{Ro} + \frac{-Vm - v_l}{Ro} \right)$$

as follows:

$$v_l = \frac{Vm}{Ro + 3 R_l} R .$$

Therefore, the range of input voltages $v_{in}$ in which the majority circuit 2 continuously obtains the load resistor $v_l$ proportional to equal input voltages of at least two of the outputs of the current transducers is:

$$-\frac{Vm}{Ro + 3 R_l} R_l < v_{in} < \frac{Vm}{Ro + 3 R_l} R_l$$

It will be understood from the above explanation that when the output voltages of the current transducers 1a, $1b$ and $1c$ fulfill the input voltage condition, the majority circuit 2 takes out the voltage proportional to the large current $Ic$.

With the current transducer arrangement according to this invention, the D.C. current of a transmission system and an A.C. current containing a D.C. component can have the magnitude and the polarity detected in electrical isolation therefrom in a response time in the order of microseconds.

A prior-art current transducer for detecting an A.C. current is larger in size than needed, in order to avoid that at any fault a transient D.C. component flows to induce a D.C. partial magnetization. In contrast, the current transducer arrangement according to this invention is free from the D.C. partial magnetization and can therefore be made small in size.

We claim:
1. A current transducer arrangement for detecting the magnitude and polarity of a large current, comprising:
   at least three current transducers each of which includes
   a. a reactor having a saturable core, and
   b. means for supplying an alternating voltage to said reactor; and
   a majority circuit which outputs a voltage proportional to a voltage value commanding a majority among output voltages of said transducers.
2. The current transducer arrangement according to claim 1, wherein said majority circuit includes
   c. scale changers to which the respective output voltages of said current transducers are inputted, and
   d. a common load resistor to which outputs of said scale changers are connected.
3. The current transducer arrangement according to claim 2, wherein said scale changers of said majority circuit have equal magnifying factors and equal output impedances.
4. The current transducer arrangement according to claim 2, wherein the number of said current transducers is three.
5. The current transducer arrangement according to claim 3, wherein the number of said current transducers is three.
6. A current transducer arrangement for detecting the magnitude and a polarity of large current, comprising:
   at least three current transducers each of which includes
   a. a primary winding,
   b. a saturable core,
   c. a secondary winding magnetically coupled with said primary winding through said saturable core, and
   d. means for supplying an alternating voltage to said secondary winding,
   the primary windings being connected in series, said large current flowing through the series-connected primary windings,
   the alternating voltages to the secondary windings having phases different from one another; and
   a majority circuit which includes
   e. scale changers to which respective output voltages of said current transducers are inputted, and
   f. a common load resistor to which outputs of said scale changers are connected.
7. The current transducer arrangement according to claim 6, wherein said scale changers of said majority circuit have equal magnifying factors and equal output impedances.
8. The current transducer arrangement according to claim 6, wherein the number of said current transducers is three.
9. The current transducer arrangement according to claim 7, wherein the number of said current transducers is three.
10. The current transducer arrangement according to claim 9, wherein said each scale changer of said majority circuit includes an operational amplifier.
11. The current transducer arrangement according to claim 9, wherein said each scale changer of said majority circuit includes
    g. an input end to which the output of the corresponding current transducer is connected,
    h. an operational amplifier,
    i. an input resistor connected between and in series with said input end and an input end of said operational amplifier,
    j. an output end,
    k. an output resistor connected between and in series with said output end and an output end of said operational amplifier, and
    l. a feedback resistor connected between and in series with said output end of said scale changer and said input end of said operational amplifier.
12. A current transducer arrangement for detecting the magnitude and polarity of a large current, comprising:
    three transducers each of which includes
    a. a primary winding,
    b. a saturable core,
    c. a secondary winding magnetically coupled with said primary winding through said saturable core,
    d. a resistor with one end connected in series with said secondary winding,
    e. an output end connected to said one end of said resistor, and
    f. means to supply an alternating voltage across the series-connected secondary winding and resistor,
    the primary winding of said current transducers being connected in series, said large current flowing through the series-connected primary windings,
    the alternating voltages, supplied to the secondary windings of said current transducers, having phases different from one another; and
    a majority circuit which includes
    g. scale changers of which input ends are connected to the respective output ends of said current transducers and which have equal magnifying factors and equal output impedances, and
    h. a common load resistor to which outputs of said scale changers are connected.
13. The current transducer arrangement according to claim 12, wherein said each scale changer of said majority circuit includes
    i. an input end to which said output end of the corresponding current transducer is connected,
    j. an operational amplifier,
    k. an input resistor connected between and in series with said input end and an input end of said operational amplifier,
    l. an output end of said scale changer,
    m. an output resistor connected between and in series with said output end of said scale changer and an output end of said operational amplifier, and
    n. a feedback resistor connected between and in series with said output end of said scale changer and said input end of said operational amplifier.

* * * * *